United States Patent
Ono

(10) Patent No.: US 8,058,734 B2
(45) Date of Patent: Nov. 15, 2011

(54) SEMICONDUCTOR DEVICE AND METHOD OF MANUFACTURING THE SAME

(75) Inventor: Hitohisa Ono, Mie (JP)

(73) Assignee: Kabushiki Kaisha Toshiba, Toyko (JP)

( * ) Notice: Subject to any disclaimer, the term of this patent is extended or adjusted under 35 U.S.C. 154(b) by 223 days.

(21) Appl. No.: 12/339,774

(22) Filed: Dec. 19, 2008

(65) Prior Publication Data

US 2009/0179332 A1 Jul. 16, 2009

(30) Foreign Application Priority Data

Dec. 20, 2007 (JP) ................. 2007-328621

(51) Int. Cl.
*H01L 23/48* (2006.01)
*H01L 23/52* (2006.01)
*H01L 29/40* (2006.01)

(52) U.S. Cl. ......... 257/775; 257/384; 257/753; 257/758

(58) Field of Classification Search .................. 257/382, 257/383, 384, 503, 750, 751, 752, 753, 758, 257/774, 775

See application file for complete search history.

(56) References Cited

U.S. PATENT DOCUMENTS

| 6,191,027 | B1 | 2/2001 | Omura | |
|---|---|---|---|---|
| 6,436,814 | B1 * | 8/2002 | Horak et al. | 438/637 |
| 6,649,508 | B1 * | 11/2003 | Park et al. | 438/618 |
| 6,680,538 | B2 * | 1/2004 | Kim et al. | 257/751 |
| 7,034,398 | B2 * | 4/2006 | Kajita et al. | 257/758 |
| 2003/0162353 | A1 * | 8/2003 | Park | 438/253 |
| 2008/0067678 | A1 * | 3/2008 | Kim | 257/750 |

FOREIGN PATENT DOCUMENTS

| JP | 10-200067 | 7/1998 |
|---|---|---|
| JP | 10-233445 | 9/1998 |

* cited by examiner

*Primary Examiner* — Matthew Smith
*Assistant Examiner* — John M Parker
(74) *Attorney, Agent, or Firm* — Oblon, Spivak, McClelland, Maier & Neustadt, L.L.P.

(57) ABSTRACT

A semiconductor device including a semiconductor substrate; a first insulating film formed on the semiconductor substrate including a contact hole opened therethrough; a lower plug filled in the contact hole having a recess defined in an upper portion thereof; a second insulating film including a via hole opened therethrough; a third insulating film formed on an inner surface of the via hole and extending in a predetermined depth from an upper edge of the via hole so as to reduce a cross sectional area thereof; and an upper plug filled in the via hole that has a protrusion formed on a lower portion thereof that conforms to the recess to electrically connect the upper and the lower plug.

7 Claims, 11 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2007-328621, filed on, Dec. 20, 2007 the entire contents of which are incorporated herein by reference.

FIELD

The present disclosure relates to a semiconductor device including multiple layers of plugs provided on a semiconductor substrate and a method of manufacturing the same.

BACKGROUND

Relentless demand for further device integration in semiconductor devices requires ever narrower spacing between device configurations. Taking a NAND flash memory for example, bit line widths and gaps between the bit lines in the memory cell region are becoming narrower with time. Thus technical challenge increases in forming narrower opening patterns in lithography processing of configurations such as contact holes and via holes.

One exemplary solution to address such technical difficulty is disclosed in a via hole processing illustrated in FIG. 2 of JP H10-233445 A in which an opening pattern is defined on an insulating film which is wide enough to be processed by lithography, whereafter the opening is narrowed to reduce its surface area by forming a spacer on the inner upper end wall of the via hole.

The disclosed method, however has the following problems.

When filling the contact hole with conductive material, a void may occur in the resulting contact plug. When a via hole is opened by etching through an overlying layer to reach the upper surface of the contact plug, the void residing in the proximity of the upper surface of the contact plug may be opened up. When an insulating films is formed as a spacer on the inner wall of the via hole under such state for shrinking the width of the via hole, the insulating film may be introduced into the opened up void and remain unremoved to cause conduction failures.

SUMMARY

The present disclosure provides a semiconductor device including a semiconductor substrate having an upper surface; a first insulating film formed on the upper surface of the semiconductor substrate, the first insulating film including a first upper surface and a first lower surface and a contact hole extending from the first upper surface to the first lower surface; a lower plug filled in the contact hole and that has a recess defined in an upper portion thereof; a second insulating film formed on the first upper surface, the second insulating film including a second upper surface and a second lower surface and a via hole extending from the second upper surface to the second lower surface; a third insulating film formed on an inner surface of the via hole, the third insulating film extending in a predetermined depth from an upper edge of the via hole so as to reduce a cross sectional area of the via hole; and an upper plug filled in the via hole that has a protrusion formed on a lower portion thereof that conforms to the recess of the lower plug to electrically connect the upper plug and the lower plug.

The present disclosure also provides a method of manufacturing a semiconductor device including preparing a semiconductor substrate having a first insulating film formed thereon; opening a contact hole that extends from a first upper surface to a first lower surface of the first insulating film and filling the contact hole with a conductive material to form a lower plug; forming a second insulating film on the first insulating film; opening a via hole that extends from a second upper surface to a second lower surface of the second insulating film and that exposes an upper surface of the lower plug; filling the via hole with a dummy film; etching back the dummy film to a predetermined height within the via hole; forming a third insulating film in the via hole to reduce a cross sectional area of the via hole; removing the dummy film by ashing; filling the via hole with a conductive material to form an upper plug; and polish removing the conductive material overlying the second insulating film and polish removing the second insulating film by a predetermined amount so as to expose the third insulating film.

BRIEF DESCRIPTION OF THE DRAWINGS

Other objects, features and advantages of the present disclosure will become clear upon reviewing the following description of the embodiment of the present disclosure with reference to the accompanying drawings, in which.

DETAILED DESCRIPTION

One embodiment employing the present disclosure to a NAND flash memory will be described with reference to FIGS. 1 to 11. References are made to the drawings hereinafter with identical or similar reference symbols when referring to identical or similar elements. Of note is that the drawings are merely schematic and the relation between the thickness and the planar dimensions and the ratio in thickness of each layer differs from the actual ratio.

Figure 1:
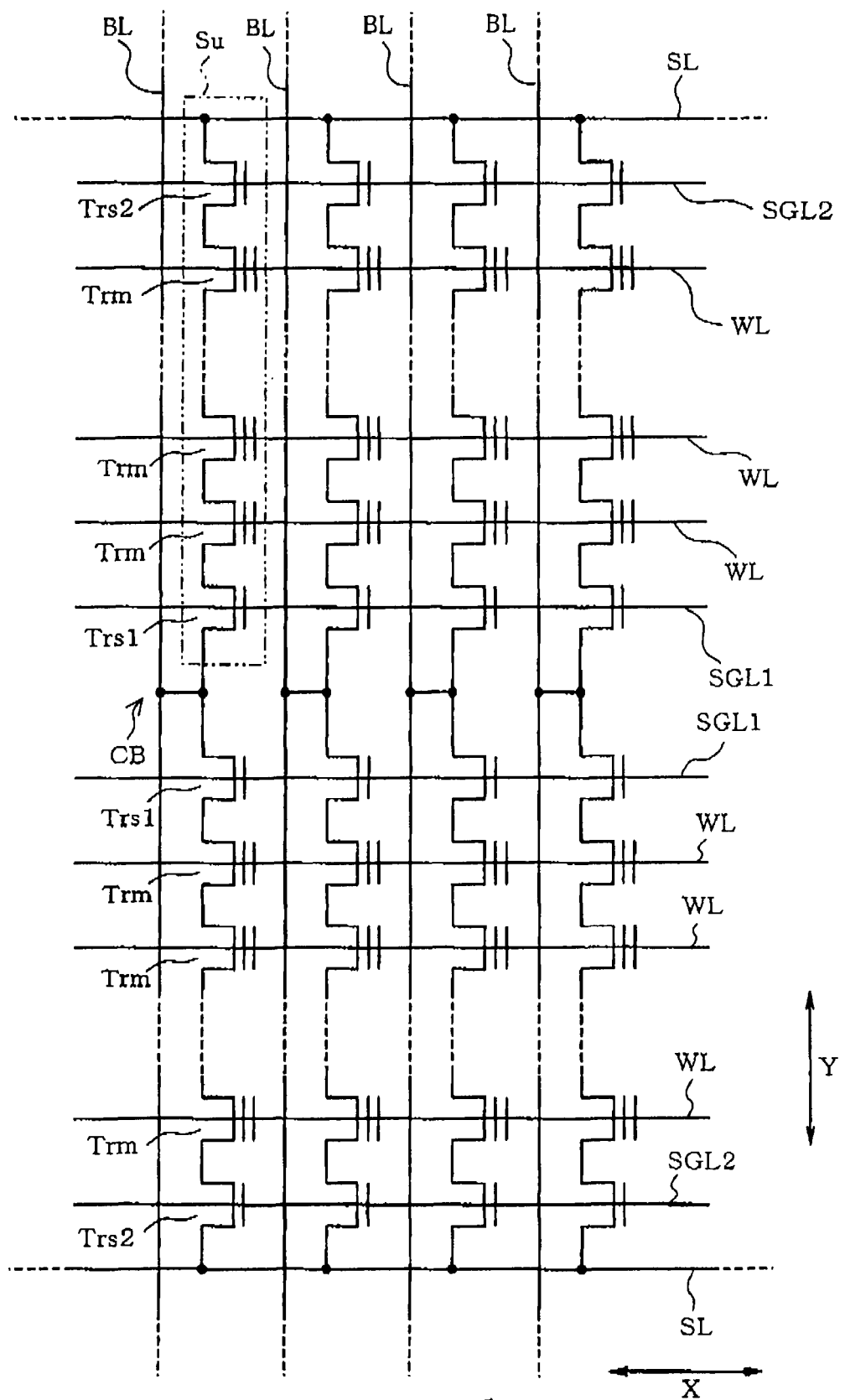
FIG. 1 is an equivalent circuit representing a portion of a memory cell array of a NAND flash memory indicating a first embodiment of the present disclosure.

First, a description will be given on the configuration of the NAND flash memory of the present embodiment. FIG. 1 illustrates an equivalent circuit representing a portion of a memory cell array formed in the memory cell region of the NAND flash memory.

The memory cell array of the NAN flash memory is configured by a matrix of NAND cell units SU. NAND cell unit SU comprises two select gate transistors Trs1, Trs2, and a plurality (8, for example: nth power of 2 (n is a positive integer)) of memory cell transistors Trm connected in series between the two select gate transistors Trs1 and Trs2. The plurality of neighboring memory cell transistors Trm shares source/drain regions within a single NAND cell unit SU.

Referring to FIG. 1, memory cell transistors Trm aligned in an X-direction (corresponding to word line direction and gate width direction) are connected to a common word line (control gate line) WL. Similarly, select gate transistors Trs1 aligned in the X-direction in FIG. 1 are connected to a common select gate line SGL1. The select gate transistors Trs2 are connected to a common select gate line SGL2. A bit line contact CB is connected to a drain region of select gate transistor Trs1. Bit line contact CB is connected to a bit line BL extending in the Y-direction (corresponding to the gate length direction and the bit line direction) perpendicularly crossing the X-direction indicated in FIG. 1. Select gate transistor Trs2 is connected to a source line SL extending in the X direction as viewed in FIG. 1 via the source region.

Figure 2:
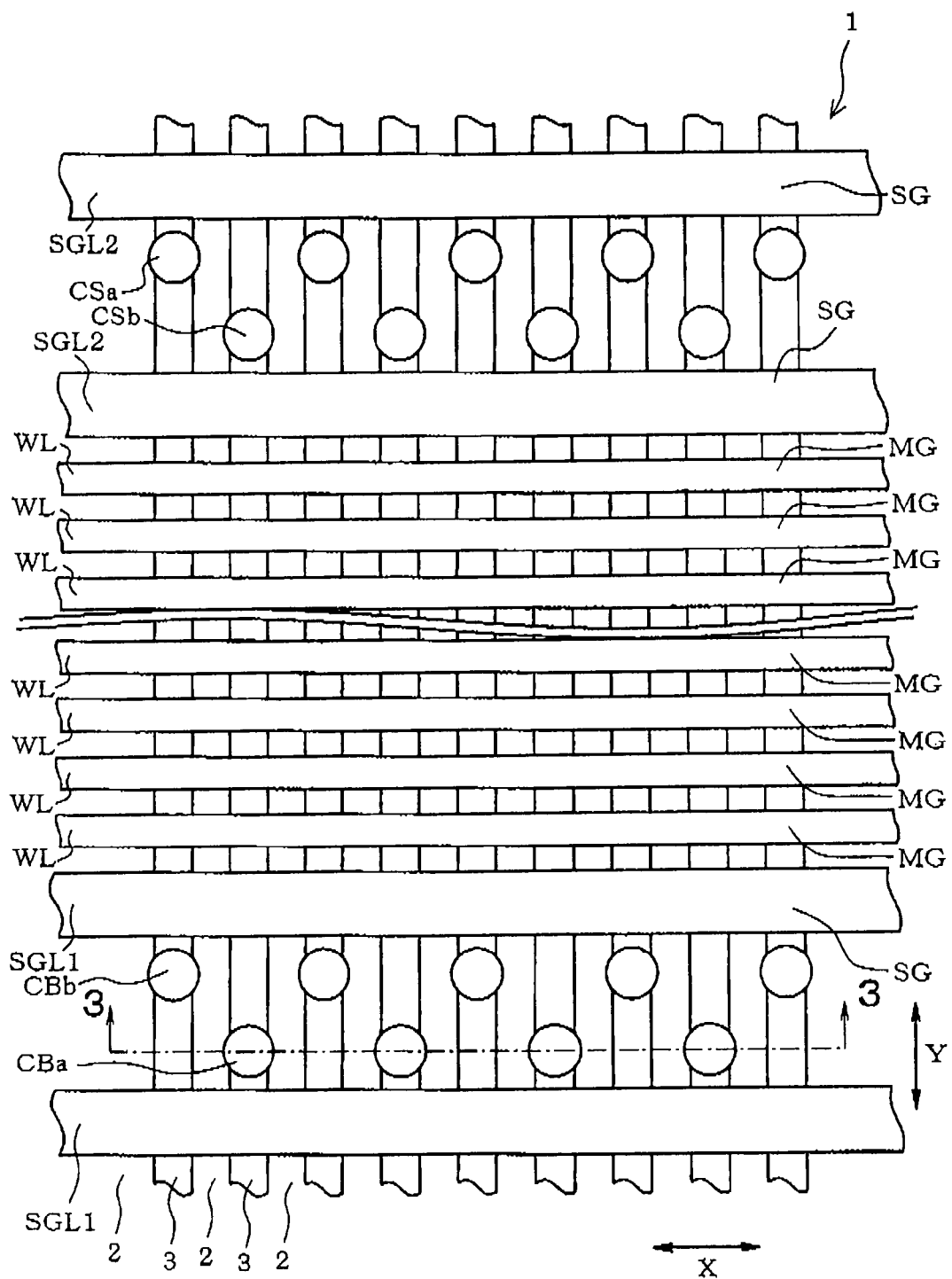
FIG. 2 is a schematic plan view indicating a partial layout of a memory cell region.

FIG. 2 is a plan view indicating a layout of a portion of the memory cell. A plurality of STIs 2 (shallow trench isolation) serving as an element isolation region is formed at a predetermined interval along the Y-direction as viewed in FIG. 2 to form active areas 3 isolated in the X-direction as viewed in FIG. 2. Word lines WL of memory cell transistors are formed at predetermined intervals along the X-direction as viewed in FIG. 2 so as to be perpendicular to active area 3.

Also, a pair of select gate lines SGL 1 for select gate transistors is formed along the X-direction as viewed in FIG. 2. Bit line contacts CBa and CBb are formed in the active area 3 residing between the pair of select gate lines SGL1. Bit line contacts CBa and CBb are provided alternately in the neighboring active areas 3. Bit line contact CBa is disposed closer to one of the couple of the paired select gate lines SGL1 whereas bit line contact CBb is disposed closer to the other of the couple of paired select gate lines SGL1 to exhibit a zigzag layout in top view.

Similarly shown in FIG. 2, at a location few word lines apart from the pair of select gate lines SGL 1, a pair of select gate lines SGL 2 for select gate transistors is formed along the X-direction. Source contacts CSa and CSb are disposed in a zigzag layout in active areas between the pair of select gate line SGL2.

At the crossover of the active area 3 and the word line WL, a gate electrode MG of the memory cell transistor is formed; whereas at the crossover of active area 3 and select gate line SGL 1 a gate electrode SG is formed.

Figure 3:
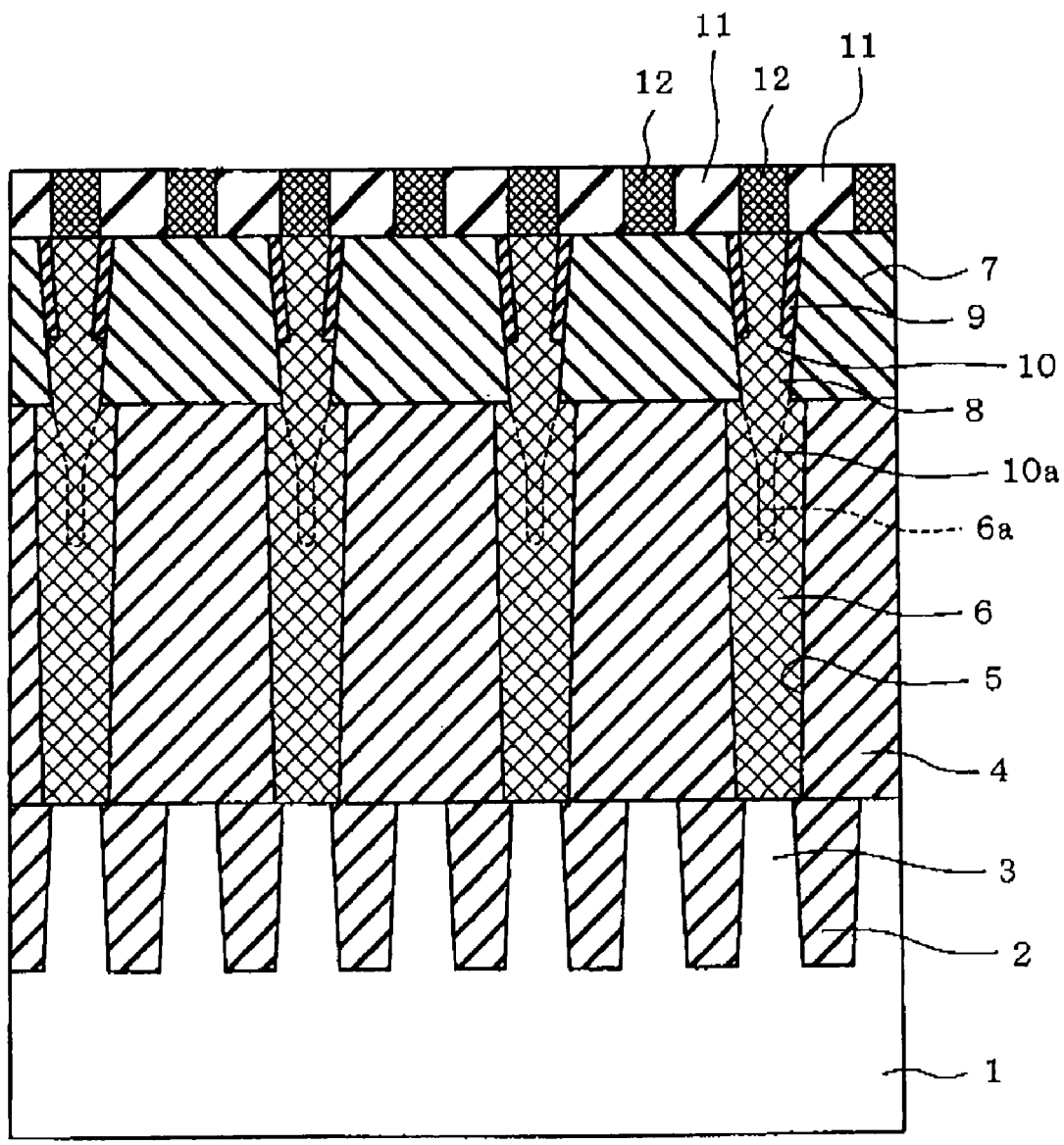
FIG. 3 is a cross sectional view taken along line 3-3 of FIG. 2.

FIG. 3 is a cross sectional view, taken along line 3-3 of FIG. 2, that schematically describes the cross section of bit line contact CBa along select gate line SGL1. As can be seen in FIG. 3, active areas 3 are defined on the surface layer of silicon substrate 1 by STI 2. STI 2 comprises trenches which are defined at predetermined interval on the surface layer of silicon substrate 1 and which are filled with an insulating film such as a silicon oxide film.

Though not shown, various films are laminated on the upper surface of silicon substrate 1, and then patterned and etched into gate electrode MG and SG. In FIG. 3, the gate structure, in other words, the laminated films are removed by etching.

On the upper surface of silicon substrate 1, a silicon oxide film 4 constituting a first insulating film is formed in a predetermined thickness so as to fill the gap between the pair of select gate lines SGL1. Silicon oxide film 4 has a contact hole 5 opened vertically through it so as to extend from its upper surface to its bottom surface. The diameter of contact hole 5 is substantially equal to the upper surface width of active area 3 in silicon substrate 1. Contact hole 5 is defined substantially perpendicular to silicon substrate 1 at a given interval, as viewed in FIG. 3, so as to expose every other row of active area in top view. Contact hole 5, however is defined on every active area 3 though not shown in the particular cross section shown in FIG. 3, so that contact hole 5 is formed on active area 3 where bit line contact CBb is formed.

Contact hole 5 is lined with barrier metal such as titanium nitride (TiN) film and filled with conductive material such as tungsten (W) to form contact plug 6 constituting a lower plug (corresponding to bit line contacts CBa and CBb). On the upper portion of contact plug 6, a recess 6a may occur which originates from and communicates with a void 6b shown in FIG. 4 which was formed when unsuccessfully filing contact plug 6. Recess 6a is exemplified as a wine glass shaped opening in FIG. 5.

Atop silicon oxide film 4, a silicon oxide film 7 constituting a second insulating film is formed in a predetermined thickness. Silicon oxide film 7 has a via hole 8 penetrating vertically through it that extends from its upper surface to its bottom surface. Via hole 8 is located with contact plug 6 of silicon oxide film 7. Via hole 8 is etched into a positive taper so that its surface area increases at higher elevation from the bottom.

At the upper inner surface of via hole 8, a spacer 9 is formed to reduce the area of the opening for a predetermined depth from the upper edge of the opening. In the present exemplary embodiment, spacer 9 comprises a silicon nitride film, for example. Spacer 9, however, may comprise any material that provides selectivity to silicon oxide film 7 in the later described RIE (Reactive Ion Etching), and thus, may comprise an SOG (Spin On Glass) film.

Via hole 8 is lined with barrier metal such as titanium nitride (TiN) and is filled with conductive material such as tungsten (W) to form a via plug 10 constituting the upper plug. The lower portion of via plug 10 is formed into a protrusion 10a that conforms with the shape of recess 6a at the upper portion of contact plug 6. The upper portion of via plug 10 is narrowed (shrunk) in diameter by spacer 9.

On the upper surface of silicon oxide film 7, a silicon oxide film 11 is formed in a predetermined thickness that constitutes an interconnect layer. Bit line groove is patterned on silicon oxide film 11 to be located with via plug 10, and the groove is filled with conductive material such as copper (Cu) to form a bit line 12. Bit line 12 is patterned in a width substantially equal to the upper surface of via plug 10 and is oriented in the Y-direction as viewed in FIG. 2 so as to be patterned substantially the same in interval layout to active area 3.

According to the above described configuration, contact plug 6 and via plug 10 are in direct contact without any materials such as a silicon nitride film at their interface so as to prevent connection failures. In the above described configuration, recess 6a resides at the upper portion of contact plug 6 that originates from void 6b which occurred when filling contact plug 6 with tungsten (W). Recess 6a is filled with protrusion 10a constituting the lower portion of via plug 10. Since no silicon nitride film used in spacer formation remains at the interface of protrusion 10a and recess 6a, via plug 10 can be formed without problems such connection failures and increased electrical resistance.

Manufacturing steps of the above described configuration will be described hereinafter with reference to FIGS. 4 to 11. The description will be given primarily on manufacturing steps of via plug 10 and contact plug 6 will be described only briefly.

Figure 4:
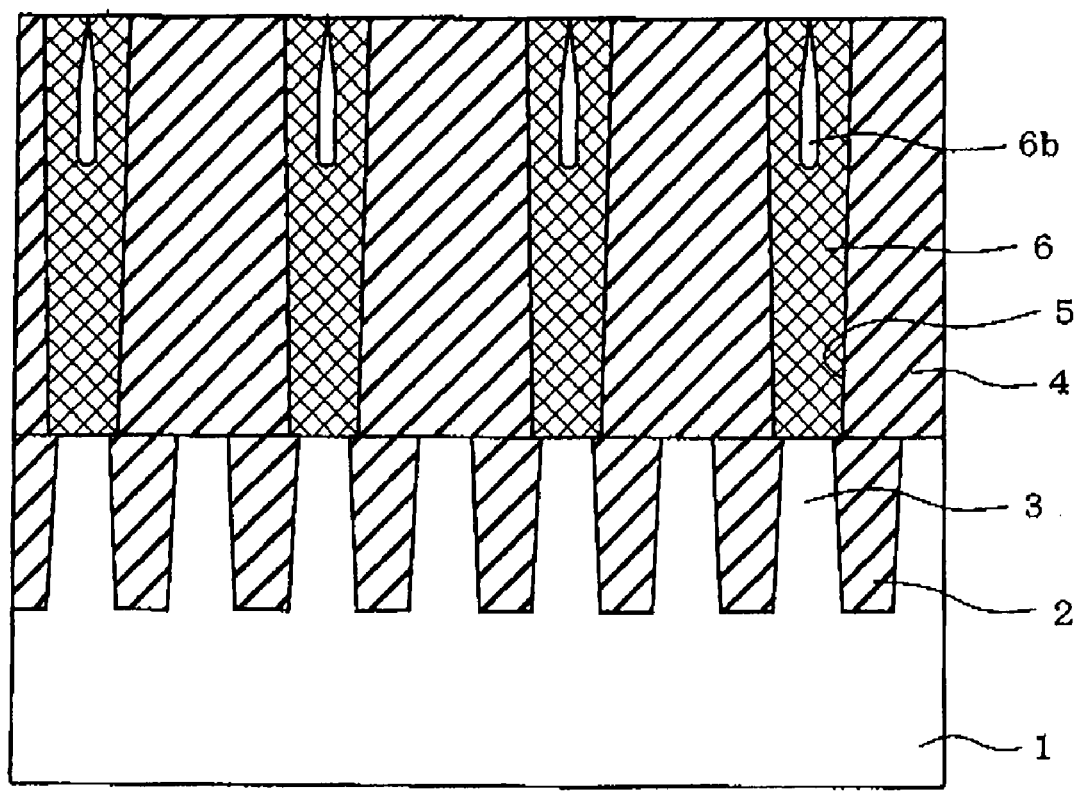
FIG. 4 is a schematic vertical cross sectional view showing one phase of a manufacturing step.

FIG. 4 shows STI 2 being formed on silicon substrate 1 to define active area 3, gate electrodes MG and SG shaped by etching, and contact plug 6 being filled in contact hole 5. To briefly describe the steps involved in obtaining the illustrated structure, first, a gate oxide film, polycrystalline silicon film, and silicon nitride film not shown are laminated on silicon substrate 1 and thereafter etched by RIE to define a trench constituting STI 2. STI 2 is formed by filling the trench with SOG film or silicon oxide film having fair fill capabilities. Then after removing the silicon nitride film, an inter-gate insulating film, polycrystalline silicon film, and silicon oxide film are laminated to configure a gate electrode. Then, the laminated structure is patterned into gate electrodes MG and SG by RIE, and word line WL, select gate lines SGL1 and SGL2 are formed thereafter.

Then, silicon oxide film 4 constituting first insulating film is filled between the resulting structures and as can be seen in FIG. 2, contact holes 5 are defined in close proximity of either of the pair of select gate lines SGL 1 to exhibit a zigzag layout in top view. Contact hole 5 is defined as a positive taper and is reduced in cross sectional surface area towards the bottom, but is generally perpendicular.

Contact hole 5 is lined with barrier metal comprising conductive material such as titanium nitride (TiN) and filled with tungsten (W). Then, tungsten film deposited on silicon oxide film 4 is removed by CMP (Chemical Mechanical Polishing) to form contact plug 6. Void 6b may occur at the upper portion of contact plug 6 depending upon the conditions in which tungsten fill is formed. Thus, void 6b may be partially exposed at the upper portion of contact plug 6 after CMP.

Figure 5:
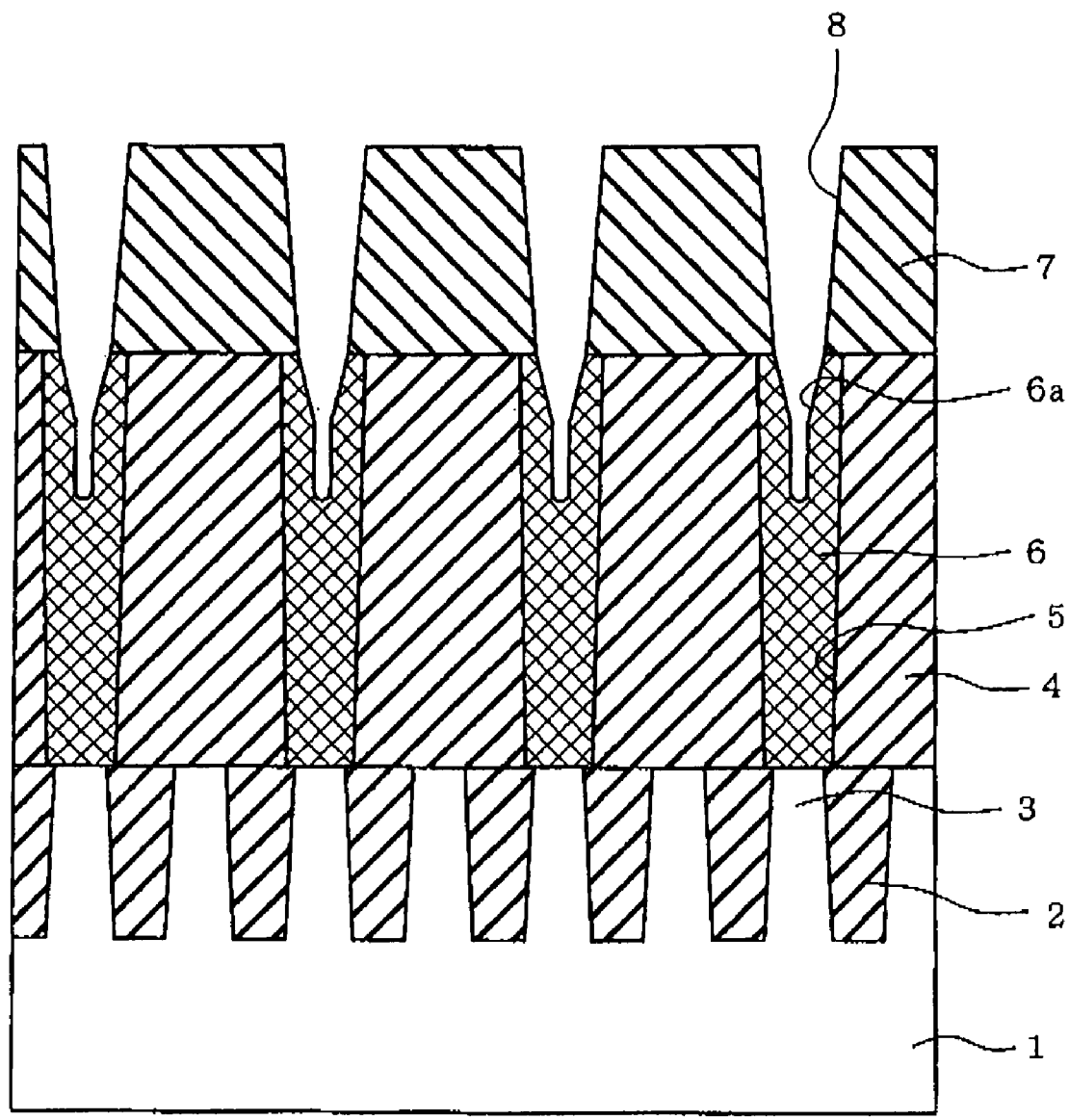
FIG. 5 is a schematic vertical cross sectional view showing one phase of a manufacturing step (2nd variation)

Referring now to FIG. 5, silicon oxide film 7 constituting a second insulating film is formed on the upper surface of the above described structure. Then, a resist pattern is formed by lithography for forming via hole 8 in a position corresponding to contact plug 6. Silicon oxide film 7 is etched by RIE to open via hole 8. RIE may progress beyond the bottom end of silicon oxide film 7 to secure clear penetration of via hole 8. In such case, the upper surface of contact plug 6 may be etched to cause void 6b to open up as recess 6a in a wine glass shape where the upper portion of recess 6a is greater in diameter than its lower portion.

Figure 6:
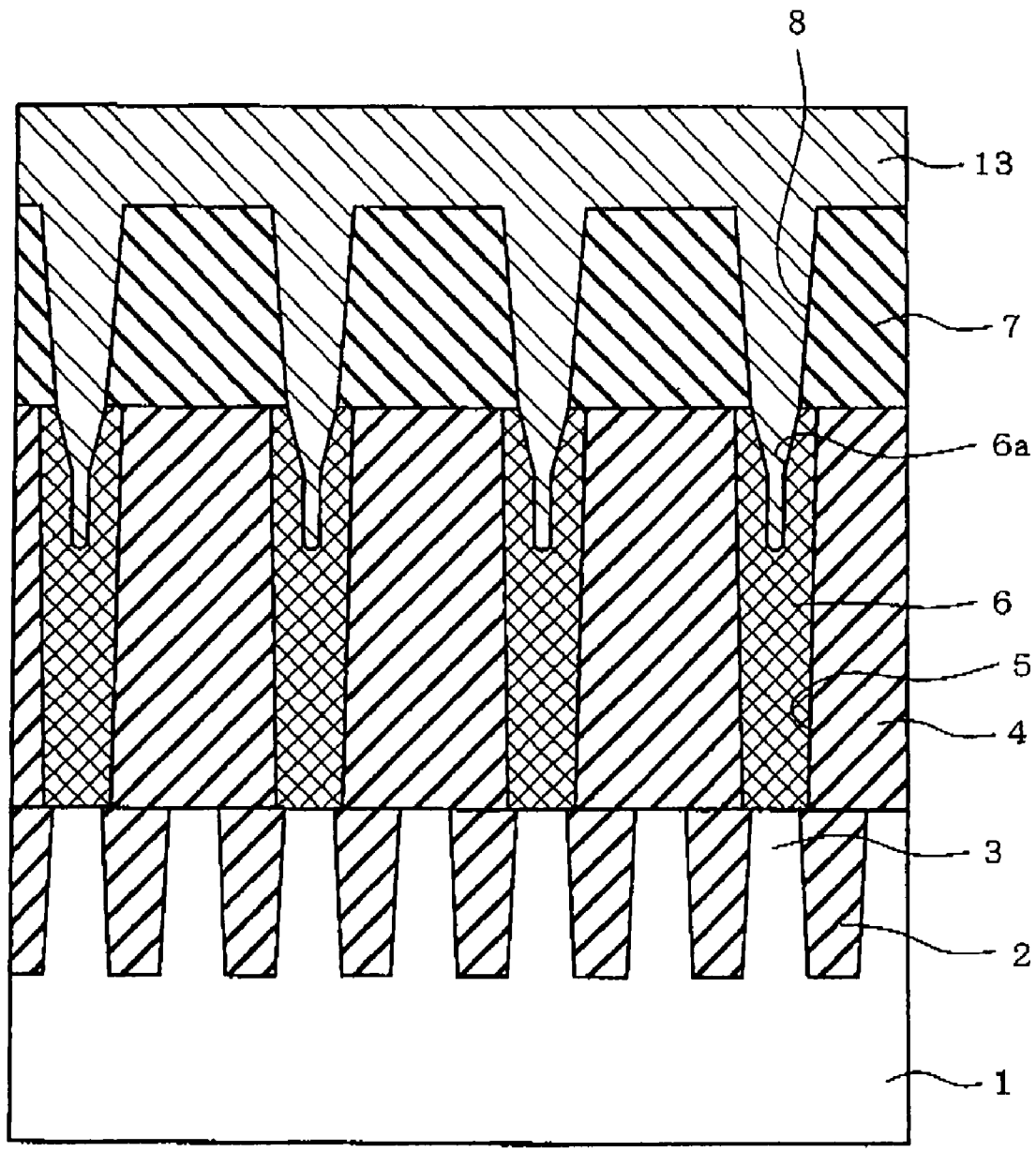
FIG. 6 is a schematic vertical cross sectional view showing one phase of a manufacturing step (3rd variation)

Next, as shown in FIG. 6, via hole 8 is filled with a carbon (C) film 13 constituting a dummy film. Carbon film 13 is deposited by CVD (Chemical Vapor Deposition) at the temperature of approximately 550 degrees Celsius. Recess 6a of contact plug 6 and via hole 8 is thus filled with carbon film 13 which is also deposited on the upper surface of silicon oxide film 7.

Figure 7:
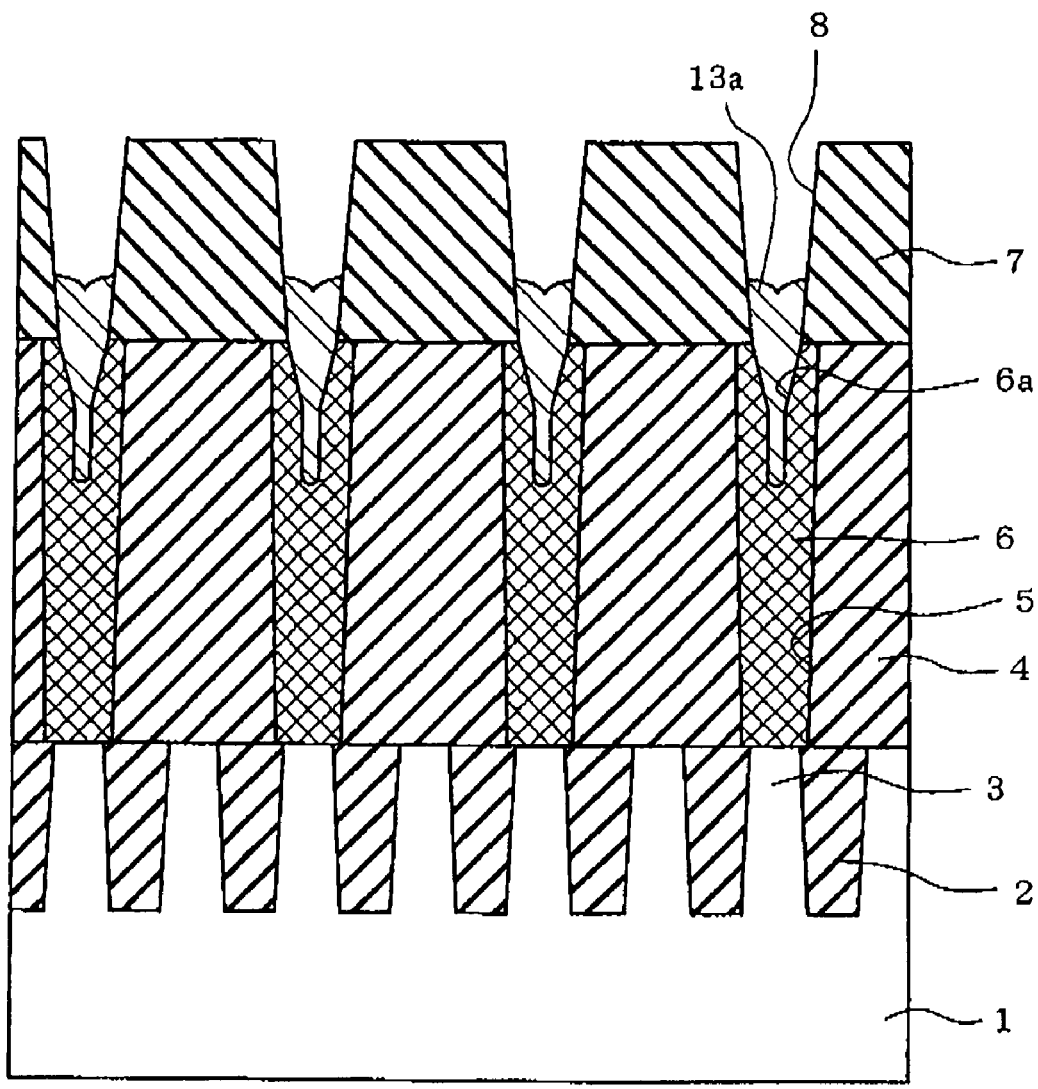
FIG. 7 is a schematic vertical cross sectional view showing one phase of a manufacturing step (4th variation)

Then, referring to FIG. 7, the entire upper surface of the above described configuration is etched by RIE to etch back carbon film 13. Carbon film 13 is etched back to the extent that the upper surface of remainder carbon film 13 has an elevation of approximately 50 nm from the lower end of via hole 8. The above described RIE causes carbon film 13a to remain at the bottom of via hole 8 and recess 6a at the upper portion of contact plug 6.

Figure 8:
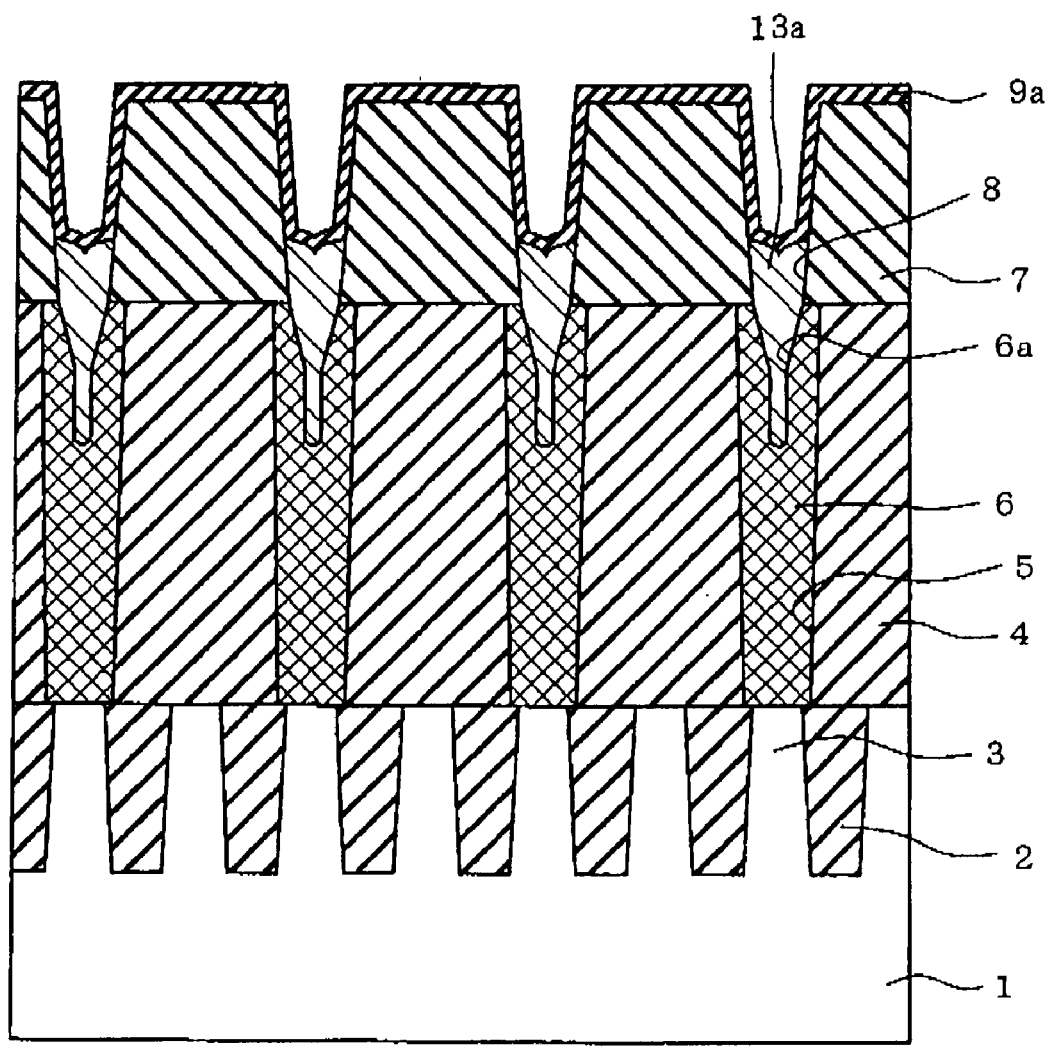
FIG. 8 is a schematic vertical cross sectional view showing one phase of a manufacturing step (5th variation)

Next, a description will be given on the step of forming spacer 9 for shrinking the diameter at the upper portion of via hole 8. FIG. 8 shows a silicon nitride film 9a constituting an insulating film which is formed into spacer 9. Silicon nitride film 9a is formed by CVD at 550 degrees Celsius, for example. Preferably, the temperature at which silicon nitride 9a is formed is equal to or less than the temperature at which carbon film 13 is formed. SOG film may also be used instead of silicon nitride film 9a as the insulating film to be formed into a spacer.

Figure 9:
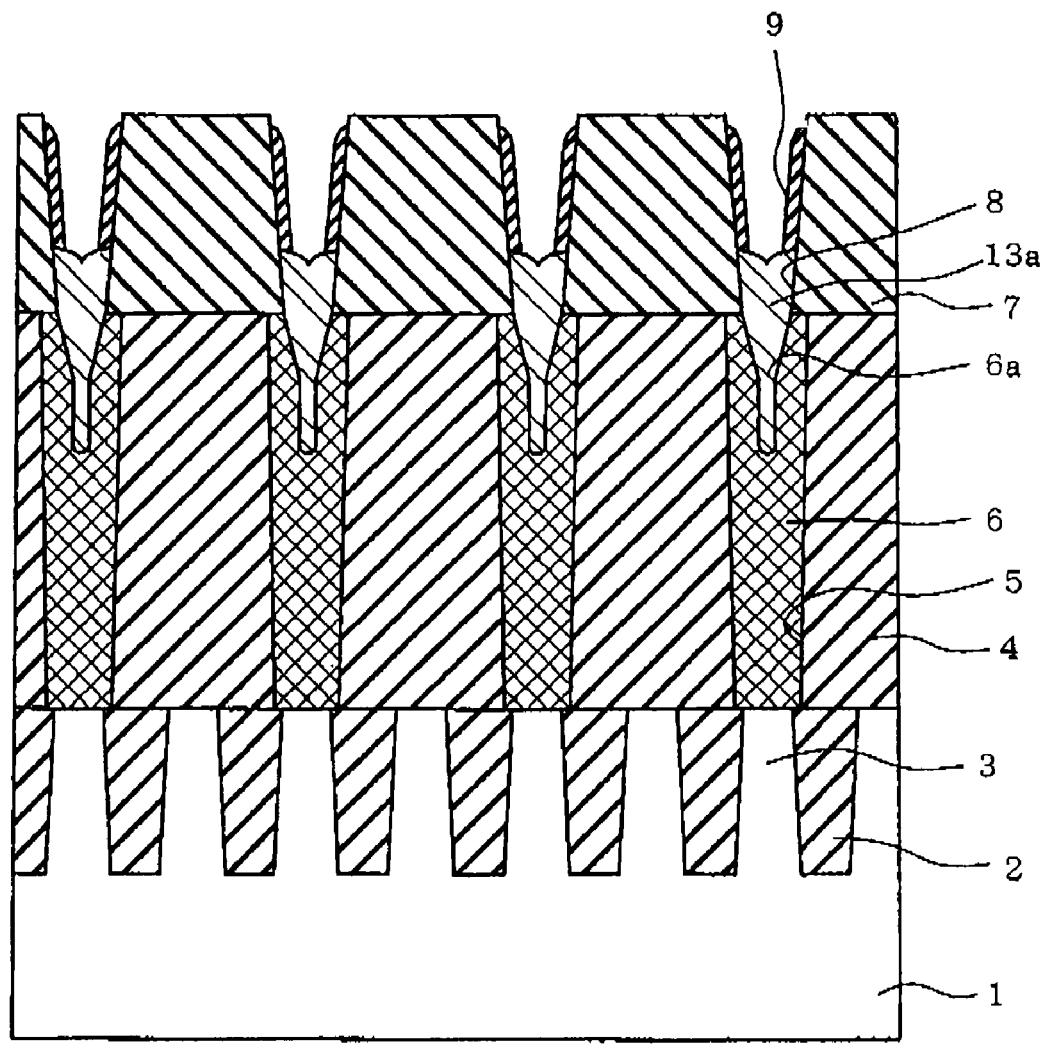
FIG. 9 is a schematic vertical cross sectional view showing one phase of a manufacturing step (6th variation)

Then, as shown in FIG. 9, silicon nitride film 9a is selectively etched to remain only on the inner sidewall of via hole 8 to form spacer 9 and removed from the upper surface of carbon film 13a and upper surface of silicon oxide film 7. It can be seen from FIG. 9 that as the result of etch, silicon nitride film 9a is slightly lowered from the upper edge of the inner sidewall of via hole 8.

Figure 10:
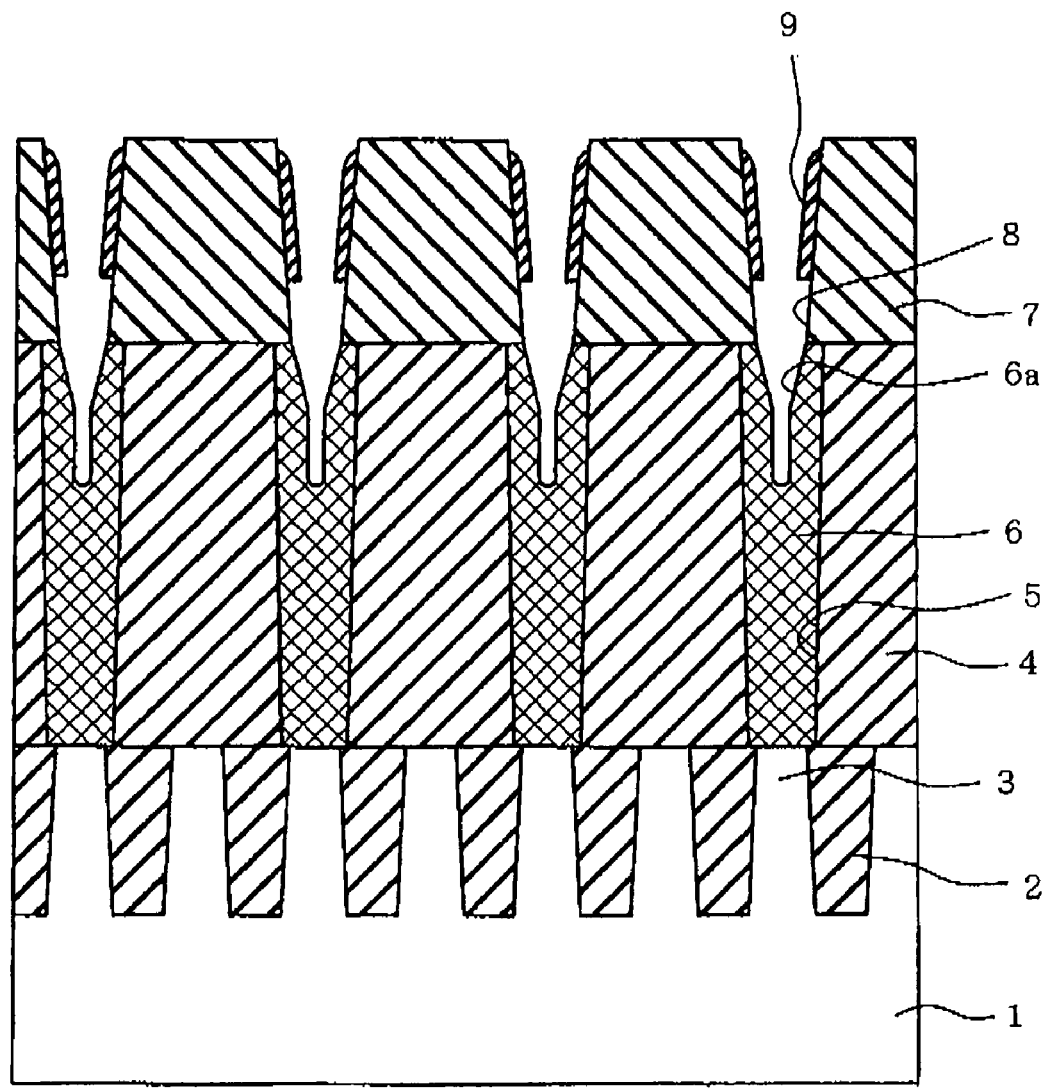
FIG. 10 is a schematic vertical cross sectional view showing one phase of a manufacturing step (7th variation)

Next, as shown in FIG. 10, carbon film 13a remaining within via hole 8 is removed by ashing, consequently leaving spacer 9 within via hole 8 to partially cover the surface of silicon oxide film 7 from a slightly lowered location from the upper edge of via hole 8. Since spacer 9 resides only partially (from a slightly lowered location from the upper edge of via hole 8 to an intermediate depth of via hole 8) along the inner sidewall of via hole 8, silicon oxide film 7 as well as the upper portion of recess 6a of contact plug 6 is exposed at portions where spacer 9 does not exist.

Figure 11:
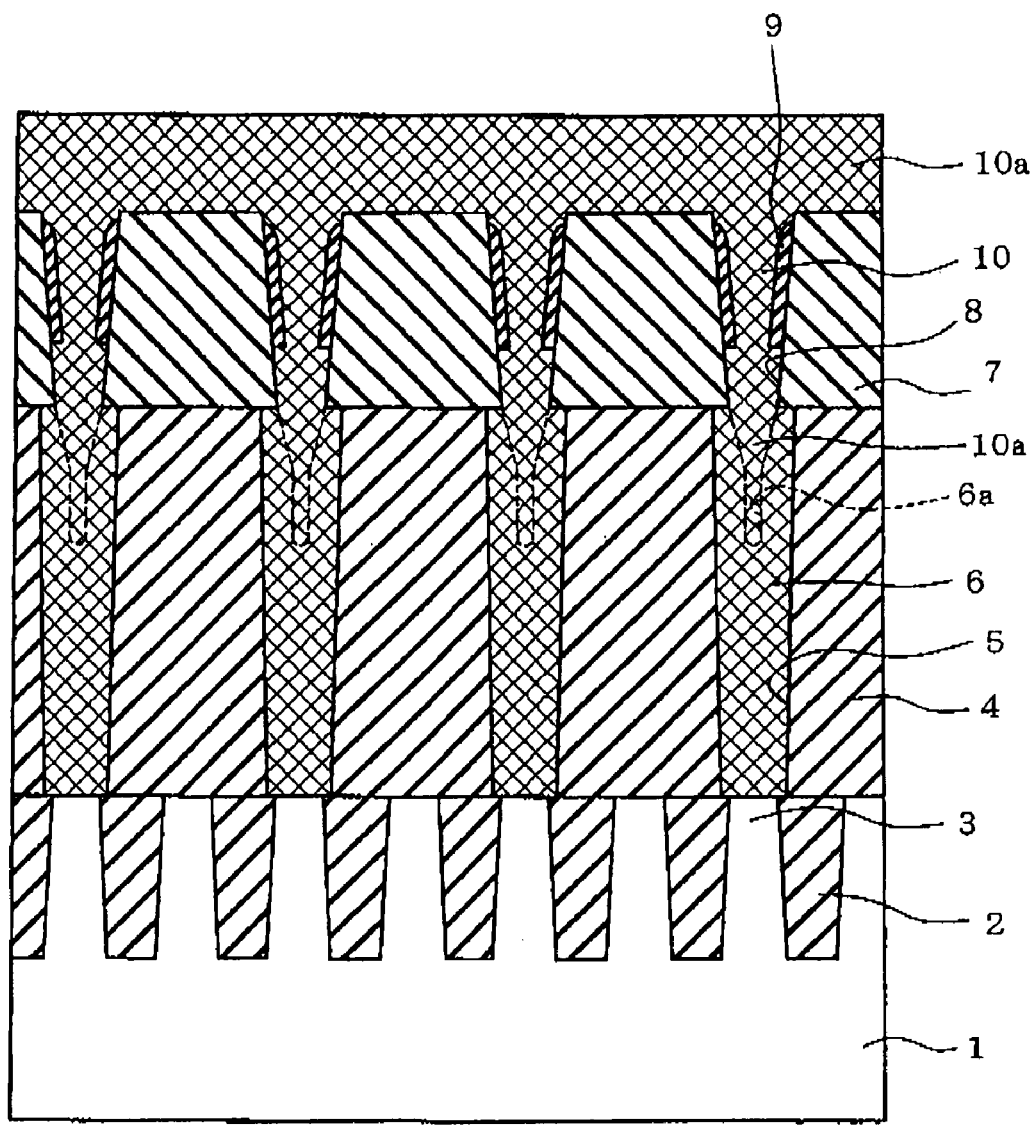
FIG. 11 is a schematic vertical cross sectional view showing one phase of a manufacturing step (8th variation).

Then as shown in FIG. 11, via hole 8 is lined with barrier metal comprising conductive material such as titanium nitride (TiN) and filled with tungsten (W) film 10a. As a result, recess 6a of contact plug 6 is also filled with conductive material, and thus, providing fair electrical connection.

Referring back to the resulting structure shown in FIG. 3, tungsten film 10a is removed by CMP. When removing tungsten film 10a by CMP, silicon oxide film 7 within via hole 8 is also removed by a predetermined amount. At this time, spacer 9 being formed on the inner upper portion of via hole 8 is also partially removed at the same time to obtain a configuration where spacer 9 resides in sufficient thickness at the upper edge of via hole 8 which is now exposed by CMP. The upper end opening of via hole 8 is thus reduced in diameter. Since the inner wall of via hole 8 exhibits a positive taper, upper end opening of via hole 8 can be reduced in diameter by intensifying CMP, in other words, by increasing the amount of removal by CMP. This means that adjustment can be made on the diameter of the upper surface opening of via hole 8 by increasing the amount of removal by CMP.

Then, silicon oxide film 11 shown in FIG. 3 is formed to serve as an interconnect layer. Then a groove constituting a bit line pattern is defined on silicon oxide film 11 by photolithography and the groove is filled with copper (Cu) serving as interconnect by damascene process to form bit line 12. Bit line 12 is formed to correspond to every contact plug 6 and thus, thus is formed over contact plug 6 shown in FIG. 3 and over unshown contact plugs 6 situated between the shown contact plugs 6. Since the upper surface diameter of via plug 10 is shrunk by spacer 9, even if via hole 8 is initially formed in large diameter, via plug 10 can be formed in reduced diameter.

The above manufacturing steps allows the diameter of the exposed upper surface of via plug 10 to be shrunk and also reduces the risk of the overlying bit line 12 contacting the neighboring via plug 10, thereby improving processability. Even if the upper surface opening of via hole 8 is shrunk by forming spacer 9 within via hole 8, silicon nitride film 9a constituting spacer 9 can be prevented from remaining in recess 6a of contact plug 6 to obtain fair electrical connection.

By applying the above described manufacturing steps, the sidewall of via hole 8 is formed into a positive taper profile. Thus, by intensifying the CMP performed after filling tungsten 10a, the upper surface diameter of via hole can be shrunk.

The present disclosure is not limited to the above described exemplary embodiment but may be modified or expanded as follows.

The insulating film constituting the spacer is not limited to silicon nitride film and SOG film but may comprise other materials that possess selectivity to the second insulating film when forming the spacer.

The spacer described in the above exemplary embodiment is formed in the extent running from the upper edge of the opening of via hole 8 to an intermediate depth (length) of via hole 8. However, the present disclosure only requires the formation of the spacer at the upper surface opening and thus, various modifications may be made as to its length; which means that spacer may be extended compared to the present exemplary embodiment as long as it does not reach or interfere with recess 6a of contact plug 6 or may be reduced in length so that it only remains in the proximity of the opening.

Dummy film may comprise films other than carbon film as long as they can be removed by ashing.

Contact plug 6 and via plug 10 comprising barrier metal and tungsten film may comprise other conductive materials such as aluminum and copper. Further, a polycrystalline silicon film heavily doped with impurities may be employed as the conductive material.

It is not a requirement to configure via hole 8 in a positive taper profile.

The present disclosure may also be applied to the contact plug for source line contact CS.

The present disclosure may be applied to NOR flash memory or other types of semiconductor devices in general that includes a contact plug and via plug configuration.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A semiconductor device, comprising:
   a semiconductor substrate having an upper surface;
   a first insulating film formed on the upper surface of the semiconductor substrate, the first insulating film including a first upper surface and a first lower surface and a contact hole extending from the first upper surface to the first lower surface;
   a lower plug filled in the contact hole and that has a recess defined in an upper portion thereof;
   a second insulating film formed on the first upper surface, the second insulating film including a second upper surface and a second lower surface and a via hole extending from the second upper surface to the second lower surface;
   a third insulating film formed on an inner surface of the via hole, the third insulating film extending in a predetermined depth from an upper edge of the via hole so as to reduce a cross sectional area of the via hole, a bottom edge of the third insulating film being located at a higher position than an upper surface of the lower plug; and
   an upper plug filled in the via hole that has a protrusion formed on a lower portion thereof that conforms to the recess of the lower plug to electrically connect the upper plug and the lower plug.

2. The device according to claim 1, wherein the third insulating film comprises a silicon nitride film or a spin on glass film.

3. The device according to claim 1, wherein the lower plug comprises tungsten (W).

4. The device according to claim 3, wherein the upper plug comprises tungsten (W).

5. The device according to claim 1, further comprising a fourth insulating film formed on the upper plug, the forth insulating film having a bit line embedded therein, wherein the lower plug is configured to be connected to the bit line.

6. The device according to claim 5, wherein the bit line comprises copper (Cu).

7. The device according to claim 1, wherein the via hole includes a sidewall configured in a positive taper so as to reduce the cross sectional area towards the second lower surface.

* * * * *